United States Patent [19]

Luscher

[11] 3,796,968

[45] Mar. 12, 1974

[54] CRYSTAL OSCILLATOR IN AIRTIGHT ENCLOSURE WITH MOBILE WALL PORTION FORMING TRIMMER CONDENSER

[75] Inventor: Jakob Luscher, Carouge/Geneva, Switzerland

[73] Assignee: Battelle Memorial Institute, Carauge/Geneva, Switzerland

[22] Filed: Mar. 19, 1973

[21] Appl. No.: 342,735

[30] Foreign Application Priority Data

Mar. 20, 1972 Switzerland........................ 4091/72

[52] U.S. Cl...................... 331/67, 310/9.4, 310/9.7, 317/249 R, 331/158, 331/177 R

[51] Int. Cl. ............................................ H03b 5/32

[58] Field of Search........... 331/67, 68, 116 M, 158, 331/177 R; 310/9.1, 9.4, 9.7; 317/249 R, 249 D

[56] References Cited

UNITED STATES PATENTS 2,515,083 7/1950 Franklin......................... 331/158 X

*Primary Examiner*—Herman Karl Saalbach
*Assistant Examiner*—Siegfried H. Grimm
*Attorney, Agent, or Firm*—Karl F. Ross; Herbert Dubno

[57] ABSTRACT

A generator of stabilized periodic signals comprises, within an airtight enclosure with predominently conductive walls, a piezoelectric quartz crystal freely supported on a pair of conductive struts and an oscillator whose frequency-determining elements include the crystal and a trimmer condenser in parallel therewith. The trimmer condenser is constituted by the variable capacitance between a displaceable wall portion of the enclosure and a confronting electrode on the crystal. A frequency divider may be disposed within the enclosure in the output of the oscillator.

10 Claims, 2 Drawing Figures

CRYSTAL OSCILLATOR IN AIRTIGHT ENCLOSURE WITH MOBILE WALL PORTION FORMING TRIMMER CONDENSER

FIELD OF THE INVENTION

My present invention relates to a generator of stabilized periodic signals, such as sine waves or pulse trains, including a free-running oscillator whose operating frequency is controlled by a piezoelectric crystal.

BACKGROUND OF THE INVENTION

For the adjustment of the operating frequency of such an oscillator it is known to include in the frequency-determining circuit thereof, generally in parallel with the crystal, a trimmer condenser whose capacitance may be varied manually or by other means.

Such systems are known to operate with a particularly low energy consumption if the crystal is a quartz oscillating in a shear mode, of a configuration sometimes referred to as AT cut, and if stray capacitances as well as the capacitance of the trimmer condenser are kept as small as possible.

Since humidity and other ambient factors tend to impair the frequency stability of the oscillator, the assembly is advantageously mounted in an airtight enclosure which should be predominantly conductive to act as an electrostatic shield.

OBJECTS OF THE INVENTION

The principal object of my present invention is to provide a highly compact signal generator of the character described whose sensitive constituents are fully protected against ambient atmospheric and electromagnetic influences but which, nevertheless, affords easy access to its trimmer condenser for the purpose of adjusting same.

A more particular object is to provide an assembly of this nature which is suitable for use in electronic timepieces.

SUMMARY OF THE INVENTION

A signal generator according to my present invention, comprising a crystal-controlled oscillator with trimmer condenser, includes an airtight enclosure forming an electrostatic shield about the crystal and the associated electronic circuitry, the enclosure having a mobile wall portion which forms part of an adjustment mechanism for controlling a variable trimmer capacitance defined by one of two excitation electrodes on the crystal body and a confronting conductive surface. This conductive surface could be part of a mobile element, within the enclosure, coupled with that wall portion so as to be kinematically unitary therewith or at least to move at a rate proportional to the displacement thereof by, for example, a screw-threaded member bearing upon it from without. I prefer, however, to simplify the structure by making the movable wall portion conductive so that it may directly coact with a confronting crystal electrode as specifically described below.

The enclosure may include an at least partly conductive mounting plate on which the crystal is supported for free vibration by a pair of conductive struts respectively terminating at the two excitation electrodes. One of these struts thus serves as a common lead for both the crystal and the trimmer condenser and may be connected to an ungrounded terminal of the oscillator proper while being insulatedly carried on the mounting plate; the other strut may directly connect the second excitation electrode (i.e. the one remote from the mobile wall portion) to the usually grounded mounting plate. The crystal body may be of generally lenticular shape, with its major surfaces paralleling the mounting plate.

Since the oscillations produced by such a system are of high frequency, generally upward of 1 MHz, I may insert a frequency divider in the output of the oscillator proper in order to provide a final frequency in a lower range, e.g. down to a few Hertz is desired. Such a frequency divider advantageously is also disposed within the shielding enclosure.

BRIEF DESCRIPTION OF THE DRAWING

The above and other features of my invention will now be described in detail with reference to the accompanying drawing in which.

SPECIFIC DESCRIPTION

Figure 1:
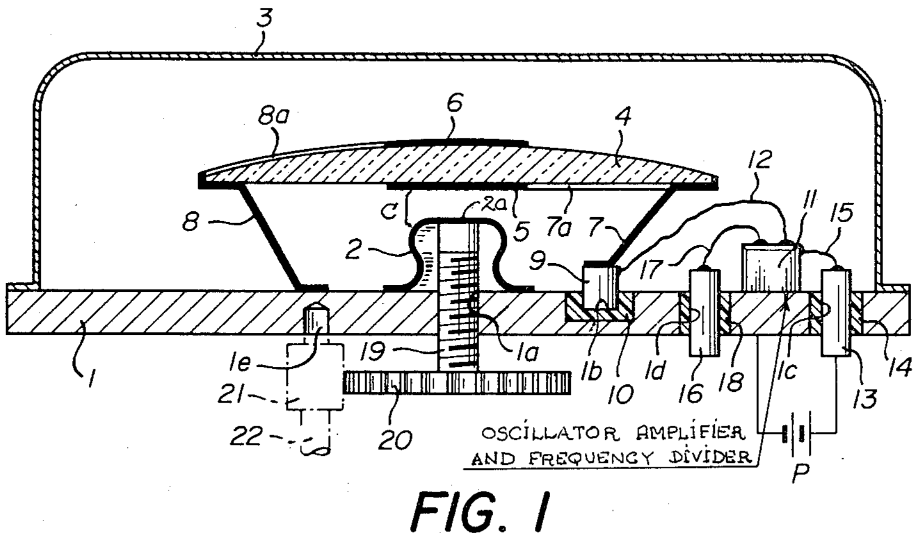
FIG. 1 is a sectional elevational view of a signal generator according to my invention.

FIG. 1 I have shown an almost completely conductive structure, including a mounting plate 1 and a domed cover 3, forming an airtight enclosure about a piezoelectric quartz crystal 4 and other constituents of an oscillation generator; some of these constituents form part of an integrated circuit or module 11 which includes an amplifier with the usual feedback circuit containing, as a frequency-determining element, the crystal 4 along with a trimmer condenser C in parallel therewith. Power is supplied to the amplifier from a direct-current source P, shown as a battery, which is disposed outside the enclosure 1, 3. The amplifier further works into a frequency divider having an output lead 17; if no frequency step-down were required, this lead would originate directly at the amplifier output. A supply conductor 15 leads from the ungrounded (here positive) terminal of battery P to module 11 from which an internal connection 12 extends to crystal 4 and trimmer condenser C. The negative battery terminal is grounded at mounting plate 1. Conductors 12, 15 and 17 could be realized as printed circuits.

Crystal 4 has a lenticular body with a flat horizontal bottom surface, spaced from mounting plate 1, and a convex upper surface spaced from the top of cover 3. These surfaces carry respective excitation electrodes 5 and 6, the upper electrode 6 being grounded via an extension 8*a* of a conductive strut 8 supporting the crystal body on mounting plate 1. Another such strut 7 is conductively tied to lower electrode 5 via an extension 7*a* and is mounted on plate 1 through the intermediary of a post 9 seated in a recess 1*b* of that plate, this post being electrically insulated from the plate itself by a dielectric insert 10. Post 9 is joined to an ungrounded terminal of module 11 by the internal lead 12.

Mounting plate 1 also has three throughgoing bores 1*a*, 1*c* and 1*d*. Bores 1*c* and 1*d* have dielectric linings 14 and 18 which insulate the plate from pins 13 and 16 seated therein, pin 13 being tied to the lead 15 which connects the positive terminal of battery P to module 11; pin 16 is tied to output lead 17 and thus serves as the take-off point for the generated periodic signals.

The centrally positioned bore 1*a* is threaded and traversed by a complementarily threaded stem 19 which is rigid with a rotatable adjusting member 20 located outside the enclosure 1, 3. The free end of stem 19 bears upon a central part 2*a* of an elastic metallic membrane 2 which is sealed to the plate 1 around the bore 1*a* and confronts the lower excitation electrode 5 to form therewith the trimmer condenser C. Rotation of member 20 in one sense or the other changes the distance between the two plates 2*a* and 5 of this trimmer condenser so as to vary its capacitance, this capacitance lying in parallel with the crystal 4 inasmuch as membrane 2 is grounded at mounting plate 1 and is therefore connected to the opposite excitation electrode 6. Member 20, if not directly accessible for manual adjustment, may be designed as a gear rotatable through a transmission here shown as including a pinion 21 on a shaft 20 which is journaled in a blind hole 1*a* on the underside of mounting plate 1.

The struts 7 and 8 may be formed integral with their extensions 7*a*, 8*a* and the associated electrodes 5, 6. The seal between the wall members 1, 2 and 3 of the airtight enclosure may be produced, advantageously, by cold welding in a vacuum.

The device shown in FIG. 1 may be used, for example, as part of the clockwork of an electronic timepiece. In a specific instance, the diameter of the capacitively effective top portion 2*a* of membrane 2 may be 3 mm, with the mean separation of this membrane portion from electrode 5 equal to 0.4 mm. The capacitance of such a trimmer condenser can be calculated at about 0.16 pF. If the pitch of the screw thread of stem 19 is, for example, 0.2 mm, a fractional turn of member 20 changes the electrode spacing to an extent causing a capacitance change of about ± 0.016 pF. In an oscillator circuit of very low energy dissipation, such a change in capacitance may entail a frequency adjustment $\Delta f/f$ on the order of $\pm 10^{-5}$ which may allow an electronic timepiece to be regulated within tolerance limits of ± 1 second per day. Even finer increments of adjustment, e.g. with a ratio $\Delta f/f$ on the order of $\pm 10^{-7}$, can be obtained with the aid of a mechanical step-down transmission as partially illustrated at 20 – 22.

Figure 2:
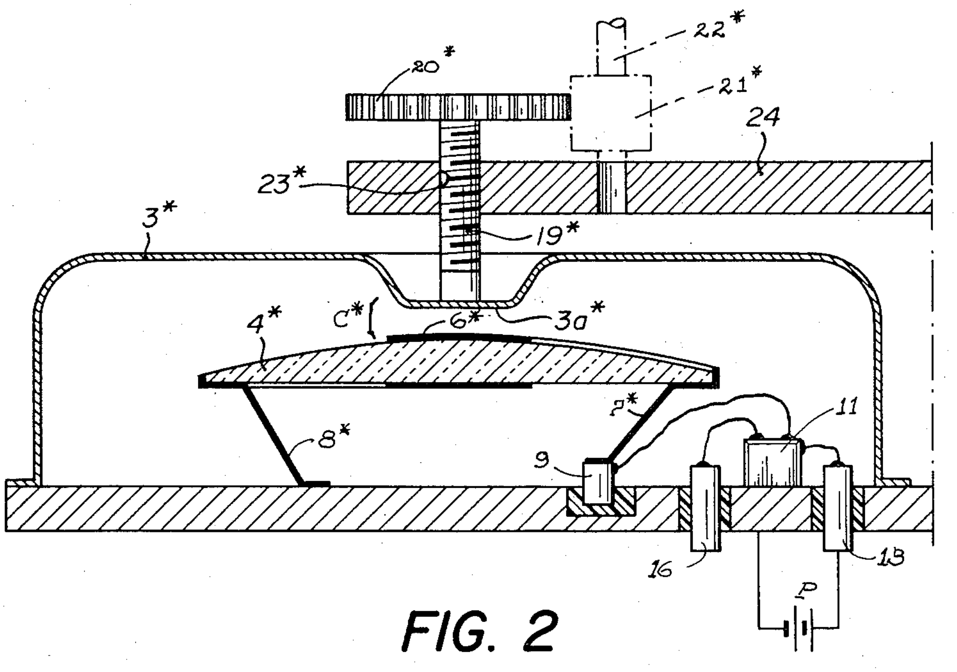
FIG. 2 is a view similar to FIG. 1, representing a modification.

In FIG. 2 I have shown a modified arrangement in which the domed cover 3 has been replaced by a cover 3* having a dished central portion 3*a** which confronts the upper excitation electrode 6* of a quartz crystal 4* to form therewith a trimmer condenser C*. The mounting plate 1*, to which the lower excitation electrode 5* is connected by way of strut 8*, differs from the plate 1 of FIG. 1 by lacking the central bore 1a as well as the blind hole 1*e*. Cover portion 3*a** is sufficiently elastic to resist downward deformation by a threaded stem 19* passing through a complementarily threaded bore 23* in a stationary shelf 24 overhanging the enclosure 1*, 3*. The shaft 22* of a pinion 21*, meshing with a gear 20* on stem 19*, is journaled in shelf 24. The remaining parts of the system of FIG. 2, whose operation is fundamentally identical with that of FIG. 1, are the same as in the first embodiment; however, the strut 7* rising from insulated post 9 extends to the upper electrode 6*.

The modification of FIG. 2 has the advantage of simplifying the construction of the metallic shell forming the airtight enclosure, with elimination of the need for separately attaching a membrane 2 to a perforated mounting plate 1.

Naturally, the frequency divider inside module 11 need not form part of the same block as the oscillator amplifier but could be disposed separately therefrom within the enclosure.

It will thus be seen that I have provided a signal geneator whose operating frequency is not influenced by such ambient factors as humidity and contamination, which avoids interference with or from external circuits, and which is of highly simple and compact construction.

The natural frequency of the quartz crystal 4 or 4*, as modified by the electrodes 5, 6 or 5*, 6* carried thereon, can be controlled during manufacturing by progressively adding to the mass of either or both electrodes, preferably the one (6 or 5*) not included in the trimmer condenser, until the quartz vibrates at the frequency approaching as closely as possible the desired oscillator frequency as determined by conventional means. This buildup of electrode material advantageously is carried out by vapor deposition under vacuum, in the absence of cover 3 or 3*.

I claim:

1. A generator of stabilized periodic signals, comprising:
   - electrostatic shield means forming an airtight enclosure with a mobile wall portion;
   - oscillator means in said enclosure provided with frequency-determining means including a piezoelectric crystal whose body has a pair of opposite surfaces provided with respective excitation electrodes;
   - adjustment means including said mobile wall portion for controlling a variable trimmer capacitance formed between one of said electrodes and a conductive surface spacedly confronting same within said enclosure; and
   - conductor means connecting said trimmer capacitance across said crystal.

2. A generator as defined in claim 1 wherein said shield means includes an at least partly conductive mounting plate galvanically joined to said conductive surface, said conductor means comprising a pair of struts spacedly supporting said crystal on said mounting plate for free vibration, said electrodes being respectively connected to said struts.

3. A generator as defined in claim 2 wherein said crystal is a quartz oscillating in a shear mode, with a generally lenticular body paralleling said mounting plate and said conductive surface.

4. A generator as defined in claim 2 wherein said mounting plate is provided with an aperture and said mobile wall portion comprises an elastic membrane overlying said aperture, said adjustment means further including a control element traversing said aperture.

5. A generator as defined in claim 2 wherein said shield means comprises a domed cover overlying said mounting plate, said mobile wall portion comprising an elastically deformable part of said cover.

6. A generator as defined in claim 2 wherein the components of said oscillator means other than said crystal are directly supported on said mounting plate and are provided with leads insulatedly traversing said mounting plate.

7. A generator as defined in claim 6 wherein said components include an amplifier and a frequency divider in the output of said amplifier.

8. A generator as defined in claim 6 wherein a source of operating current for said oscillator means is connected between said mounting plate and one of said leads outside said enclosure.

9. A generator as defined in claim 2 wherein one of said struts conductively connects said one of said electrodes to a terminal of said oscillator means and is insulatedly carried on said mounting plate, the other strut connecting the other of said electrodes to said mounting plate.

10. A generator as defined in claim 1 wherein said conductive surface is part of said mobile wall portion.

* * * * *